United States Patent [19]
Steinhardt et al.

[11] Patent Number: 5,489,362
[45] Date of Patent: Feb. 6, 1996

[54] METHOD FOR GENERATING EXCITED NEUTRAL PARTICLES FOR ETCHING AND DEPOSITION PROCESSES IN SEMICONDUCTOR TECHNOLOGY WITH A PLASMA DISCHARGE FED BY MICROWAVE ENERGY

[75] Inventors: Heinz Steinhardt, Wien; Josef Mathuni, Munich, both of Germany

[73] Assignee: Secon Halbleiterproduktionsgeraete Gesellschaft mbH, Wien, Germany

[21] Appl. No.: 211,472
[22] PCT Filed: Sep. 30, 1992
[86] PCT No.: PCT/EP92/02268
§ 371 Date: Aug. 29, 1994
§ 102(e) Date: Aug. 29, 1994
[87] PCT Pub. No.: WO93/07639
PCT Pub. Date: Apr. 15, 1993

[30] Foreign Application Priority Data

Sep. 30, 1991 [DE] Germany ............... 41 32 558.3

[51] Int. Cl.$^6$ ............................................. H01L 21/00
[52] U.S. Cl. ................... 156/643.1; 118/723 MR; 118/723 ME; 204/192.1; 204/298.08; 427/575
[58] Field of Search ............... 156/646.1, 643.1, 156/345; 118/728, 723 ME, 723 MR, 723 MW; 204/190.1, 192.32, 298.08, 298.38; 216/69; 427/575, 569

[56] References Cited

U.S. PATENT DOCUMENTS

| | | | |
|---|---|---|---|
| 4,943,345 | 7/1990 | Asmussen et al. | 156/643 |
| 5,049,843 | 9/1991 | Barnes et al. | 333/246 |
| 5,111,111 | 5/1992 | Stevens | 315/11141 |
| 5,132,105 | 7/1992 | Remo | 423/446 |
| 5,350,454 | 9/1994 | Ohkawa | 118/723 R |
| 5,385,624 | 1/1995 | Amemiya | 156/345 |
| 5,389,153 | 2/1995 | Paranjpe | 118/723 MP |
| 5,389,154 | 2/1995 | Hiroshi | 118/723 MR |

FOREIGN PATENT DOCUMENTS

0415122A2  3/1991  European Pat. Off. .
2716592   10/1977  Germany .

OTHER PUBLICATIONS

"Plasma Sources Based On The Propagation Of Electromagnetic Surface Waves", Journal of Physics D: Applied Physics, Jul. 14, 1991, vol. 24, No. 7, pp. 1025–1048.
Applications Of Plasma Processes To VLSI Technology, Copr. 1985, pp. 122–157.
"3 Schichttechnik", 9 pages.
"Downstream Plasma Etching And Stripping", Solid State Technology/Apr. 1987, pp. 147–151.
"CDE Series Model CDE–VIII Microwave Downstream Etching System" by Tylan/Tokuda, Specifications and System Description, Apr. 1, 1986, pp. 1–5.

Primary Examiner—R. Bruce Breneman
Assistant Examiner—Joni J. Chang
Attorney, Agent, or Firm—Hill, Steadman & Simpson

[57] ABSTRACT

A plasma discharge tube (5) having a diameter that corresponds to a quarter wavelength of the standing wave is selected and the waveguide system (2) is dimensioned and tuned such that the standing wave forms a first voltage maximum at a first side of the plasma discharge tube (5) and the standing wave is also supplied reflected, so that it forms a second, anti-phase voltage maximum at a second side of the plasma discharge tube (5) that lies opposite the first side and faces toward an end termination (12) of the waveguide system (2). A controlled magnetic field is applied in order to achieve an especially low working pressure.

10 Claims, 2 Drawing Sheets

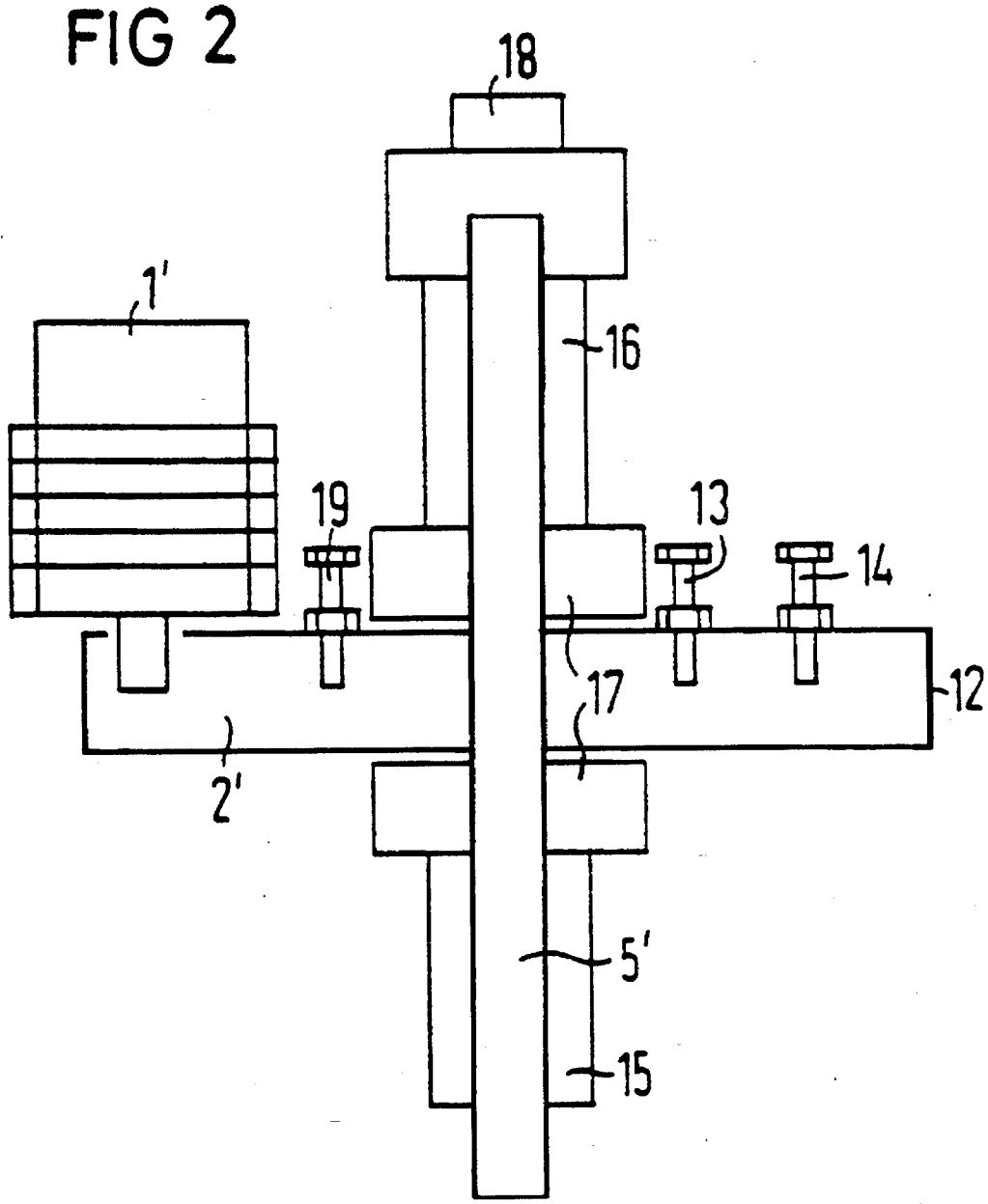

METHOD FOR GENERATING EXCITED NEUTRAL PARTICLES FOR ETCHING AND DEPOSITION PROCESSES IN SEMICONDUCTOR TECHNOLOGY WITH A PLASMA DISCHARGE FED BY MICROWAVE ENERGY

BACKGROUND OF THE INVENTION

1. Field of the Invention

The present invention is directed to a method for generating excited neutral particles for etching and deposition processes in semiconductor technology on the basis of a plasma discharge fed by microwave energy, whereby microwave energy having a specific frequency is generated, is coupled into a waveguide system and, as a standing transversal electrical wave, is concentrated therein at predetermined locations, and whereby process gases intended for excitation are conducted through the waveguide system with a plasma discharge tube aligned in the direction of the electrical field of the wave, whereby a plasma is ignited and excited particles are generated. The invention is also directed to an apparatus for the implementation of this method.

2. Description of the Related Art

A method for generated excited neutral particles of said species is known from T. Sugano, "Applications of Plasma Processes to VLSI Technology", Wiley-Interscience, New York, 1985, Sections 2.2 and 2.3 (particularly see 2.2.2).

In addition to lithography and doping techniques, etching and deposition techniques are fundamental processes that are employed again and again in the process sequence for manufacturing LSI circuits of silicon substrates (see, in general, "Technologie hochintegrierter Schaltungen", D. Widmann, H. Mader, H. Friedrich, Springerverlag 1988, particularly Sections 3.1.1 and 5.2..2–4). For example, an important method is vapor phase deposition, also called CVD, whereby it is presently often standard to undertake the excitation of the initial reaction gases to form dissociated, reactable constituents and the initiation of the deposition reaction primarily not on the basis of an elevation of the temperature (of the silicon wafer) to approximately 1000° C. but to undertake this by a plasma or by a high-energy radiation. Dry etching processes, for which the formation of a gaseous, volatile reaction product is a prerequisite, also usually only proceed spontaneously, i.e. without 10 the application of external energy when the gases are already present in atomic form.

It is obviously a critical concern for the successful implementation of such etching and deposition processes to generate high-energy and, therefore, reactable neutral particles, particularly radicals, with an adequately high efficiency. The technical solution of this demand is increasingly being striven for simultaneously with satisfaction of the farther-reaching demands for a prevention of the influence of electrical fields and charged particles on the substrate to be processed and for an optimally broad range of working pressure for the etching and deposition processes.

In order to protect the substrates against undesired electrostatic fields and against ions, which are always co-produced in addition to the neutral particles in the standard dissociation of process gases in a plasma gas discharge, it is known to spatially separate the generation of excited neutral particles from their employment in an etching or deposition process occurring in a reaction chamber (downstream process). Due to the short life span of the charged particles, their concentration decreases greatly immediately after the excitation zone in the downstream method, whereas the excited neutral particles—as a consequence of their substantially longer life span-reach the reaction chamber in what is a suitable concentration for many applications via a suitable feeder. Magnetron generators having a working frequency of a number of GHz are often utilized as energy sources for the radio-frequency plasma discharge in order to generate corresponding microwaves. This energy is coupled into a cavity resonator or, respectively, into a waveguide system and—on the basis of suitable dimensioning and tuning—is concentrated therein at specific locations in the form of a standing wave. A plasma discharge tube is then usually conducted through the waveguide system at one of these locations, i.e. exactly at a location at which the energy of the standing wave concentrates. In this way, radicals having a long life span can be generated in process gases that are supplied to the plasma discharge tube and can be subsequently conveyed to the reaction chamber with a feeder. The localization of the energy of the standing wave at the correct location is basically unproblematical; however, a substantial part of the energy is not converted to excitation but is reflected untuned and must be absorbed in the waveguide, usually in a water load, so that the magnetron is not damaged (see Sugano, Opp. Cit., Section 2.2.2).

The described, only partial conversion of the available microwave energy proves problematical particularly in the light of the afore-mentioned demand for a broad range of working pressures insofar as it is precisely the low pressure range below approximately 13, particularly below 1.3 Pa, that is interesting and advantageous for semiconductor technology.

Low pressures are of significance, for example, for surface-controlled CVD processes in order to avoid depositions having undesired layer properties. In etching processes, too, a high etching rate and the prevention of microload effects, i.e. a local etching rate dependent on the environment, can often only be realized at extremely low pressures. However, ignition difficulties in the plasma discharge already begin to arise in the pressure range below 13 Pa, since the excitation density and, thus, the efficiency of the generating decrease too greatly.

It is in fact known (see Sugano, Op. Cit., Section 2.3.2) to also stabilize the plasma in the pressure range below $13 \times 10^{-2}$ Pa with the assistance of being enclosed in a magnetic field whose cyclotron frequency is in resonance with the frequency of the microwaves (ECR method). As proceeds, for example, from the article "Downstream Plasma Etching and Stripping", by J. M. Cook, Solid State Technology, Apr. 1987, particularly 150, excited neutral particles cannot be made available in adequate numbers and with adequate density overall with such methods, i.e. particularly at the wafer itself. This is not surprising in view of the fact that only at most 30% of the microwave energy in the discharge is converted even given improved ECI methods.

Taking a method that can be manipulated into consideration, moreover, it is also not possible to substantially increase the infed microwave energy itself, usually approximately 1 kW, in order to enhance the efficiency of the generating.

SUMMARY OF THE INVENTION

It is an object of the invention to provide a method of the species initially cited and to provide an apparatus for the implementation of this method that, in particular, has an adequately high efficiency in the pressure range below approximately 13 Pa.

In a method of the species initially cited, this object is achieved in that a plasma discharge tube having a diameter that corresponds to a quarter wavelength of the standing wave is selected and the waveguide system is dimensioned and tuned such that the standing wave forms a first voltage maximum at a first side of the plasma discharge tube and the standing wave is also supplied reflected, so that a second, anti-phase voltage maximum forms at a second side of the plasma discharge tube that is opposite the first side and faces toward an end termination of the waveguide system.

The method of the invention is preferably developed such that, given a working pressure of process gases below approximately 13, particularly below 1.3 Pa, electrons generated in the plasma are forced onto helical orbits with an applied, particularly controlled magnetic field, whereby, in particular, the magnetic field that is optimum for the respective working pressure is identified with a sensor means and is set such that the maximum of particle generation is achieved.

In conformity with the stated object, the following are provided for the implementation of the method of the invention:

An apparatus having a microwave generator that makes microwave energy available in a waveguide system, the microwave energy concentrating as a standing transversal electrical wave of a defined frequency at predetermined locations, whereby the waveguide system preferably comprising a rectangular cross section comprises leadthroughs for a plasma discharge tube that is aligned in the direction of the electrical field of the wave and is conducted through opposite walls of the waveguide system, whereby, given an ignited plasma discharge, a continuous generation of excited neutral particles from supplied process gases is present in the plasma discharge tube, and whereby the plasma discharge tube comprises a diameter corresponding to a quarter wavelength of the standing wave, and the waveguide system is dimensioned such and provided with tuning means such that the end termination of the waveguide system represents a reflection face and that wall of the plasma discharge tube facing toward it comes to lie in the voltage maximum of the standing wave supplied reflected, whereas that wall of the plasma discharge tube facing toward the microwave generator comes to lie in a voltage maximum of the standing wave, so that two anti-phase voltage maximums are available at two opposite sides of the plasma discharge tube for igniting and maintaining the plasma discharge.

The invention is based on the perception that only the energy of a single half-wave voltage maximum, which should come to lie in the middle of the plasma discharge tube insofar as possible on the basis of appropriate tuning, is converted for the plasma discharge in the known method. As a result of the measures of the invention, by contrast, two anti-phase voltage maximums at opposite sides of the plasma discharge tube are made available for the plasma discharge, whereby the appertaining maximum of current comes to lie in the middle of the plasma discharge tube because of its spacing of a quarter wavelength established by the diameter. The greatest possible voltage advantage, which has been doubled in comparison to the previous method, is thereby exploited, so that a power conversion that is four times higher results.

It is also advantageous that it is not simply two half-wave maximums of the standing wave that are exploited.

On the contrary, for example with the assistance of a reflection face at the end termination of the waveguide system as well as with the assistance of the tuning of the reflected part of the standing wave with a phase shifter, the standing wave is also supplied reflected and, thus a second voltage maximum at the spacing of only a quarter wavelength from a voltage maximum of the standing wave is exploited. In that the energy is utilized concentrated onto the smallest space as a result of the measures of the invention, a high-energy plasma with a high plasma temperature forms, this also remaining stable at low pressures. High etching or, respectively, deposition rates can be achieved due to the high efficiency with which the highly excited particles are generated.

Overall, nearly all of the energy generated by the microwave generator is employed for the plasma discharge or, respectively, for generating radicals, so that the excitation density of the particles is so high that it is comparable in terms of effect with a thermal activation. More than 50% of all existing gas molecules are excited even in the low pressure range down to approximately $5 \times 10^{-2}$ Pa.

Further advantages of the invention are achieved in a method characterized in that, given a working pressure of the process gases below approximately 13, particularly below 1.3 Pa, electrons generated in the plasma are forced onto spiral orbits with an applied magnetic field, particularly a controlled magnetic field. This method is further characterized in that the magnetic field that is optimum for the respective working pressure is identified with a sensor means and is set such that the maximum of the particle generating is achieved. A particular embodiment of the method is characterized in that a pressure gauge means is employed as sensor means, whereby the increase in pressure corresponding to an increasing particle generation is identified and is employed for setting the optimum magnetic field.

In the method, the brightness of the plasma discharge is employed for tracking the magnetic field. The maximum of occurring, specific wavelengths of the excited gas is identified by emission spectroscopy and is employed for setting the magnetic field.

According to the invention, the excited neutral particles are supplied with a feeder from the plasma discharge tube to a reaction chamber for etching and deposition processes which is separated therefrom.

The invention also provides an apparatus for the implementation of the method, comprising a microwave generator that makes microwave energy available in a waveguide system, said microwave energy concentrating at predetermined locations as a standing transversal electrical wave having a specific frequency, whereby the waveguide system preferably comprising a rectangular cross section comprises leadthroughs for a plasma discharge tube that is aligned in the direction of the electrical field of the wave and is conducted through opposite walls of the waveguide system, whereby, given an ignited plasma discharge, a continuous generation of excited neutral particles from supplied process gases is present in the plasma discharge tube, characterized by the features:

the plasma discharge tube comprises a diameter corresponding to a quarter wavelength of the standing wave;

the waveguide system is dimensioned such and is provided with tuning devices such that the end termination of the waveguide system represents a reflection face and the wall of the plasma discharge tube facing toward it comes to lie in the voltage maximum of the standing wave supplied reflected, whereas the wall of the plasma discharge tube facing toward the microwave generator comes to lie in a voltage maximum of the standing wave, so that two anti-phase voltage maximums at two opposite sides of the plasma discharge tube are available for igniting and maintaining the plasma discharge.

In the apparatus for the implementation of the method, means are present for generating a magnetic field that increases the excitation density of the particles and can be controlled on the basis of a sensor means, whereby the sensor means, which preferably comprises a pressure gauge means, is designed for identifying the optimum magnetic field strength.

BRIEF DESCRIPTION OF THE DRAWINGS

The invention shall be set forth in yet greater detail on the basis of an exemplary embodiment and with reference to the attached drawing. Shown are:

FIG. 2 a part of an apparatus for the implementation of a method of the invention.

DETAILED DESCRIPTION OF THE PREFERRED EMBODIMENTS

Figure 1:
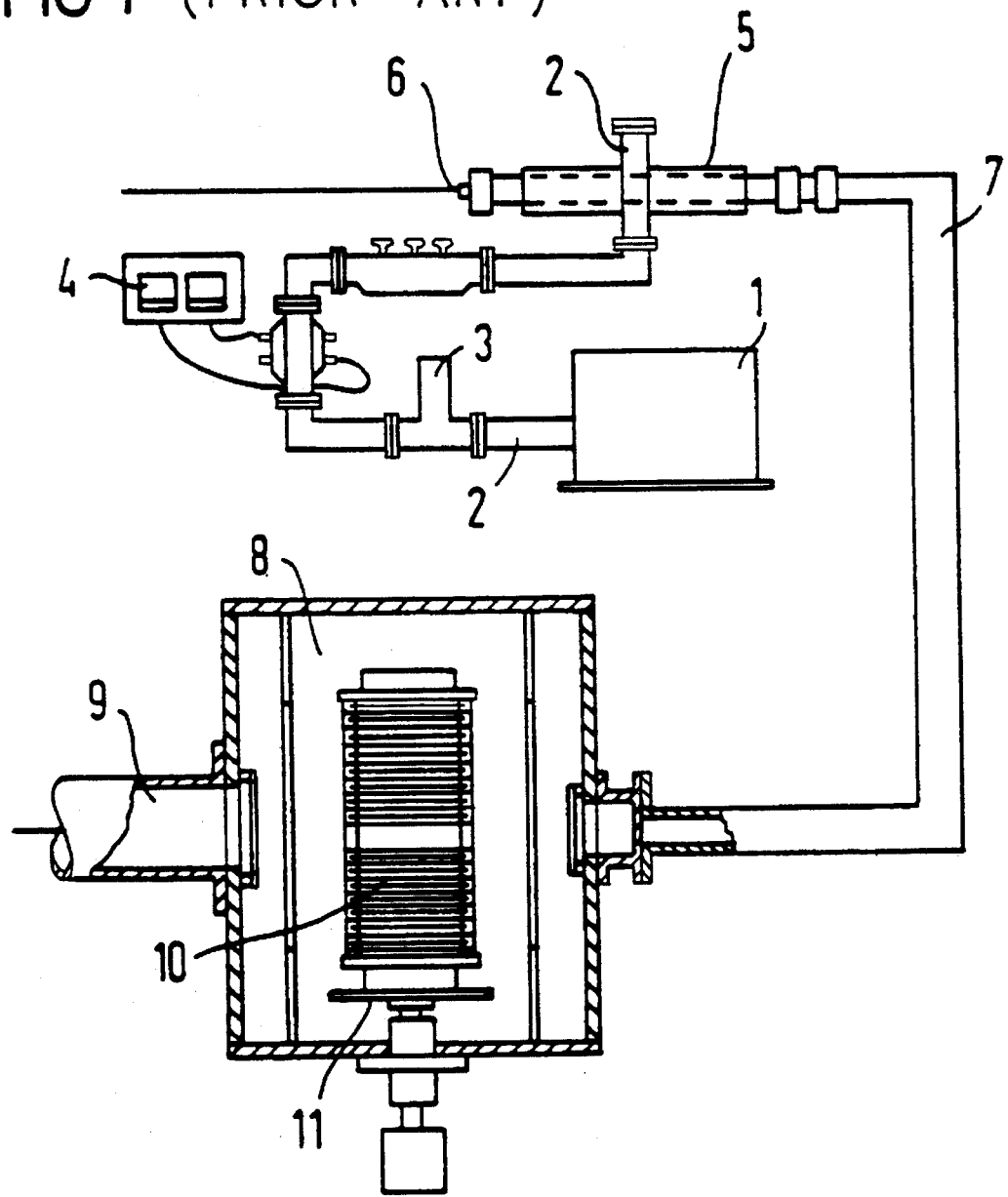
FIG. 1 a schematic of a known, commercially available downstream etching system with microwave excitation taken from the sales brochure "Model CDE-VIII Microwave Downstream Etching System", Specification #850008, 1 April 1986, Revision 2 of the company Tylan/Tokuda, USA.

FIG. 1 shows a microwave generator 1 that generates microwaves that are coupled into a waveguide system 2. With the assistance of a tuning unit 4 and due to the dimensioning of the waveguide system 2, a standing wave forms with which the microwave energy is concentrated at predetermined locations of the waveguide system. The energy that is reflected untuned and is not converted must be absorbed somewhere in the waveguide system 2, for example in the T piece 3 or at the end of the waveguide 2, this usually occurring with a water load. For generating radicals on the basis of microwave energy, a plasma discharge tube 5 that is aligned in the direction of the electrical field of the standing wave is conducted through the waveguide system 2. When suitable process gases are supplied to the input 6 of the plasma discharge tube 5 and the plasma is ignited, then, among other things, excited neutral particles also arise. These are subsequently conveyed to the etching reaction chamber 8 with a feeder 7 that is approximately 1 meter long. Excited neutral particles thus proceed onto the surface of substrate wafers 10 secured on a turntable 11 where they trigger desired etching reactions. The reaction chamber 8 can be evacuated with a pump 9 and the volatile reaction products can be extracted.

The method of the invention, which requires only a slight modification of the known etching system for being implemented, enables the conversion of the microwave energy available with the highest possible efficiency in a working range from barely 300 Pa to below $13 \times 10^{-2}$ Pa. This is achieved, on the one hand, in that the plasma discharge tube 5 has a diameter of 30 mm, corresponding to a quarter wavelength, given a working frequency of 2.45 GHz, which corresponds to a wavelength of 12 cm.

FIG. 2 shows a plasma discharge tube 5' that is mounted such in the waveguide system that the side facing toward the magnetron 1' comes to lie in the voltage maximum of the standing wave, whereby the wall of the plasma discharge tube 5' (just as at the opposite side) can be intersected by the voltage maximum; however, the voltage maximum can also be advantageously located at the inside of the wall. The plasma discharge tube 5' itself is preferably fabricated of an insulating material such as quartz or aluminum oxide. A reflection face is provided as an end termination 12 of the waveguide systems 2'. The reflected energy is tuned such with a tuning means that the standing wave returned reflected reaches a voltage maximum at that side of the plasma discharge tube 5' facing toward the reflection face. A direct, mechanical tuning with tuning pins 13 and 14 in a known way can ensue on the basis of a phase shift. As a surface wave, the standing wave simultaneously propagates at the top and bottom in the waveguide system 2' preferably having a rectangular cross section (approximately 80×40 mm) close to the approximately 80 mm wide limiting surfaces, so that a transverse discharge and a further, intervening discharge arise. Deriving overall is that energy is coupled into the plasma discharge tube 5' with extremely high efficiency with this method, so that, for example, an etching rate that is approximately 3 through 5 times higher than in known methods results due to the high density of neutral particles. Finally, sleeve dipoles 15 and 16 that damp the emission as mechanical throttles, a sensor means 18 as well as magnetic field windings 17 are also shown in FIG. 2.

In order to be able to generate radicals with full efficiency in the downstream method even in the low pressure range below 13, particularly below 1.3 Pa, the excitation density can be increased by applying a magnetic field, particularly a controlled magnetic field. The fact that, given gas discharge paths, the effective ionization can be increased with a magnetic field in that electrons must librate in a helical motion and, thus, have a lengthened ionization path is already known in and of itself as the Penning effect.

What is critical, however, is that the magnetic field only acts in the plasma discharge zone and is not tuned to a fixed value of the electron-cyclotron resonant field strength (circular paths) as in likewise known ECR sources, but that the magnetic field that is optimum for the respective working pressure is identified with a sensor means 18 and is set such that the maximum of the particle generation is achieved. Implemented tests show that there is in fact an appertaining magnetic field maximum increasing with decreasing pressure per working pressure as optimum in view of the generating. This is presumably because the spiral orbits of the electrons in the plasma become too tight and, thus, ineffective given too high a magnetic field.

An increase in volume occurs due to the dissociation of the process gases in the plasma discharge tube. A pressure gauge means can therefore be advantageously employed as sensor means, whereby the increase in pressure corresponding to an increasing generation of particles is evaluated and is employed for tracking or, respectively, for setting the optimum magnetic field.

As a further sensor method, the brightness of the plasma discharge can be employed for tracking the magnetic field, whereby the maximum of the brightness thereby also corresponds to the maximum of the dissociation. The maximum of occurring, specific wavelengths of the excited gas can also be identified with emission spectroscopy and can be employed for setting the magnetic field.

Although other modifications and changes may be suggested by those skilled in the art, it is the intention of the inventors to embody within the patent warranted hereon all changes and modifications as reasonably and properly come within the scope of their contribution to the art.

We claim:

1. A method for generating excited neutral particles for etching and deposition processes in semiconductor technology using a plasma discharge fed with microwave energy, comprising the steps of:

generating microwave energy with a frequency, coupling said microwave energy into a waveguide system, concentrating said microwave energy, as a standing transversal electrical wave, at locations, for excitation, conducting specific process gases through the waveguide system with a plasma discharge tube aligned in direction of the electrical field of the wave, whereby a plasma is ignited and excited particles are generated, selecting a plasma discharge tube having a diameter corresponding to a quarter wavelength of standing wave, dimensioning and tuning the waveguide system such that the standing wave forms a first voltage maximum at one side of the plasma discharge tube and the standing wave is also supplied reflected, so that it forms a second, anti-phase voltage maximum at a second side of the plasma discharge tube that lies opposite the first side and faces toward an end termination of the waveguide system.

2. A method according to claim 1, further comprising the step of:

given a working pressure of the process gases below approximately 13 Pa, forcing electrons generated in the plasma onto spiral orbits with an applied magnetic field.

3. A method according to claim 2, further comprising the steps of:

identifying the magnetic field that is optimum for the respective working pressure with a sensor means and setting the magnetic field such that a maximum of the particle generating is achieved.

4. A method according to claim 3, further comprising the step of:

using a pressure gauge means as the sensor means, whereby an increase in pressure corresponding to an increasing particle generation is identified and is employed for setting an optimum magnetic field.

5. A method according to claim 3, further comprising the step of:

using brightness of the plasma discharge for tracking the magnetic field.

6. A method according to claim 3, further comprising the steps of:

identifying a maximum of occurring, specific wavelengths of the excited gas by emission spectroscopy, and using said maximum for setting the magnetic field.

7. A method according to claim 1, further comprising the steps of:

supplying the excited neutral particles with a feeder from the plasma discharge tube to a reaction chamber for etching and deposition processes which is separated therefrom.

8. An apparatus for generating excited neutral particles, comprising:

a waveguide system;

a microwave generator that makes microwave energy available in said waveguide system, said microwave energy concentrating at locations as a standing transversal electrical wave having a specific frequency, a plasma discharge tube of a diameter corresponding to a quarter wavelength of the standing wave;

the waveguide system being dimensioned such and being provided with tuning devices such that an end termination of the waveguide system represents a reflection face and a wall of the plasma discharge tube facing toward it comes to lie in a voltage maximum of the standing wave supplied reflected, whereas the wall of the plasma discharge tube facing toward the microwave generator comes to lie in a voltage maximum of the standing wave, so that two anti-phase voltage maximums at two opposite sides of the plasma discharge tube are available for igniting and maintaining the plasma discharge.

9. An apparatus according to claim 8, further comprising:

means for generating a magnetic field that increases excitation density of the particles and can be controlled on the basis of a sensor means, whereby the sensor means is for identifying an optimum magnetic field strength.

10. A method as claimed in claim 2, wherein said working pressure is below 1.3 Pa.

* * * * *